(12) United States Patent
McMurtre

(10) Patent No.: US 6,924,716 B2
(45) Date of Patent: Aug. 2, 2005

(54) METHOD AND APPARATUS FOR REDUCTION OF ELECTROMAGNETIC FEED THROUGH IN A SAW FILTER

(75) Inventor: Hugene McMurtre, Fort Worth, TX (US)

(73) Assignee: Motorola, Inc., Schaumburg, IL (US)

( * ) Notice: Subject to any disclaimer, the term of this patent is extended or adjusted under 35 U.S.C. 154(b) by 91 days.

(21) Appl. No.: 10/616,837

(22) Filed: Jul. 10, 2003

(65) Prior Publication Data

US 2005/0007215 A1 Jan. 13, 2005

(51) Int. Cl.[7] .............................................. H03H 7/12
(52) U.S. Cl. ...................... 333/174; 333/193; 333/185
(58) Field of Search ............................... 333/193–196; 310/313 R, 313 B, 313 C, 313 D

(56) References Cited

U.S. PATENT DOCUMENTS

| | | | |
|---|---|---|---|
| 5,093,638 A | * | 3/1992 | Kinsman et al. ............ 333/195 |
| 5,162,822 A | | 11/1992 | Wakamori |
| 5,646,584 A | | 7/1997 | Kondratyev et al. |
| 5,933,062 A | * | 8/1999 | Kommrusch ................. 333/193 |
| 6,377,137 B1 | | 4/2002 | Ruby |
| 6,426,683 B1 | * | 7/2002 | Gu et al. ..................... 333/174 |
| 2003/0214371 A1 | * | 11/2003 | Yip ............................. 333/193 |

OTHER PUBLICATIONS

Colin K. Campbell, Ph.D., D.Sc. "Understanding Surface Acoustic Wave (SAW) Devices for Mobile and Wireless Applications and Design Techniques", Aug. 2003.

* cited by examiner

Primary Examiner—Vibol Tan
(74) Attorney, Agent, or Firm—Steven C. Parmelee

(57) ABSTRACT

An apparatus for improving the stop band response of a surface acoustic wave device (200) comprising a surface acoustic wave device (200) having internal electromagnetic coupling (106) and external electromagnetic coupling (108) and acoustic coupling (104); and a cancellation network (250, 251) coupled to the surface acoustic wave device to reduce the internal electromagnetic coupling (106) and external electromagnetic feed through (108); wherein the cancellation network (250, 251) reduces the amount of electromagnetic feed through at the output (102) of the surface acoustic wave device (200).

23 Claims, 8 Drawing Sheets

METHOD AND APPARATUS FOR REDUCTION OF ELECTROMAGNETIC FEED THROUGH IN A SAW FILTER

FIELD OF THE INVENTION

The present invention relates generally to filters. Even more specifically, the present invention relates to a surface acoustic wave filters.

BACKGROUND

Surface Acoustic Wave (SAW) filters are used in many applications, including, for example, in mobile/wireless transceivers, radio frequency (RF) filters, Intermediate Frequency (IF) filters, resonator-filters for one and two-way pagers, resonator-filters for one and two-way medical alert transmitters, filters for mobile and wireless circuits, IF filters in a Base Transceiver Station (BTS), RF front-end filters for mobile/wireless circuitry, multimode frequency-agile oscillators for spread-spectrum secure communications, delay lines for low power time-diversity wireless receivers, nyquist filters for microwave digital radio, voltage controlled oscillators for first or second stage mixing in mobile transceivers, Pseudo-Noise-coded delay lines for combined code division multiple access/time division multiple access (CDMA/TDMA) access, clock recovery filters for fiber-optics communication repeater stages, synchronous, spread-spectrum communications, televisions, video recorders, and many other applications.

One problem with current SAW filters is the differential between the pass band and the stop band. SAW filters have an acoustic response, and also have electromagnetic (EM) feed through. Often, much of the stop band of the SAW filter is made up of the EM feed through in the SAW filter. The greater the differential between the pass band and the stop band of the SAW filter, the better the device will typically perform in a system or apparatus. Such EM feed through is a combination of internal and external electromagnetic feed through. Thus, a reduction of the EM feed through will usually improve the differential between the pass band and the stop band of the SAW filter.

Some SAW filters are designed to reduce or minimize the amount of internal EM coupling that is present in the SAW filter. One solution to the problem has been to attempt to reduce the amount of EM coupling, thus improving the differential between the pass band and the stop band. One way in which the internal EM coupling can be reduced is by including electrodes of opposing polarity within the SAW filter. This reduces the internal EM feed through by feeding current in opposite directions to two sets of electrodes on the acoustic substrate. Additionally, most SAW filters will have some measure of internal EM coupling that has not been properly shielded or has not been shielded at all and will be present in the output of the SAW filter. Thus, while a manufacturer may attempt to reduce internal EM coupling the manufacturer of the SAW filter has no control over the external EM coupling that may take place as this will vary from application to application.

BRIEF DESCRIPTION OF THE DRAWINGS

The above and other aspects, features and advantages of the present invention will be more apparent from the following more particular description thereof, presented in conjunction with the following drawings wherein.

Figure 1:
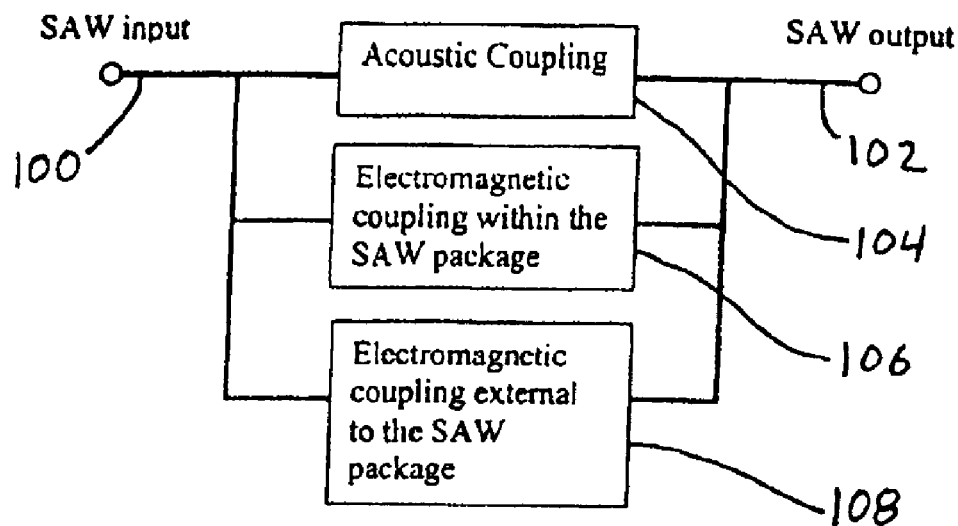
FIG. 1 is a block diagram illustrating the coupling that is present in a SAW filter.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are typically not depicted in order to facilitate a less obstructed view of these various embodiments of the present invention.

DETAILED DESCRIPTION

The following description is not to be taken in a limiting sense, but is made merely for the purpose of describing the general principles of the invention. The scope of the invention should be determined with reference to the claims.

One embodiment can be characterized as an apparatus for improving the stop band response of a surface acoustic device comprising a surface acoustic wave device having external electromagnetic coupling and acoustic coupling; and a cancellation network coupled to the surface acoustic wave device to reduce the external electromagnetic feed through; wherein the network reduces the amount of electromagnetic feed through at the output of the surface acoustic wave device.

Another embodiment provides a method for canceling electromagnetic feed through comprising the steps of providing a surface acoustic wave device having external electromagnetic feed through; coupling a cancellation network to the surface acoustic wave device; and reducing the external electromagnetic feed through at the output of the surface acoustic wave device A further embodiment may be characterized as a method for canceling electromagnetic feed through comprising the steps of providing a surface acoustic wave device having external electromagnetic feed through; coupling an adjustable cancellation network to the surface acoustic wave device; and adjusting the cancellation network to reduce the electromagnetic feed through in the stop band of the surface acoustic wave device.

In accordance with a preferred embodiment a reduced stop band response in a SAW filter is achieved. Other embodiments provides for a reduction in internal and external EM feed through of a SAW filter. Still other embodiments provide for a reduction or cancellation of external EM feed through of a SAW device.

Referring to FIG. 1, shown are the different types of coupling that are present in a SAW device. This figure illustrates in particular an input 100, an output 102, acoustic coupling 104, internal electromagnetic coupling 106, and external electromagnetic coupling 108 as pertains to a SAW device.

As shown in FIG. 1, the input 100 to the SAW device is affected by the acoustic coupling 104 of the SAW device, the internal electromagnetic coupling 106, and the external electromagnetic coupling 108. Therefore, the output 102 of the SAW device is a combination of the acoustic coupling 104 of the SAW device including any electromagnetic coupling introduced into the device, either from inside or outside the SAW device. Generally, the acoustic coupling 104 characteristics of the SAW device are not changed by external influences. However, the internal electromagnetic coupling 104 and the external electromagnetic coupling 106 can be cancelled out or reduced as described herein.

In accordance with the embodiments described herein, when the net phase and amplitude of all contributors to electromagnetic feed through are known, a network can be connected to the SAW device, such that the electromagnetic coupling can be cancelled out without affecting the acoustic characteristics of the SAW device. An adjustable cancellation network can be used to sample the input signal, adjust the phase and amplitude of the sampled signal, and sum a canceling signal to the output signal, thus canceling the electromagnetic feed through. The net phase and amplitude of the cancellation circuit that will cancel the internal electromagnetic coupling and the external electromagnetic coupling can be found by using adjustable tuning elements. This will be further described herein with reference to FIG. 2. Once the values for the tunable elements are determined that will substantially cancel or at least reduce the electromagnetic feed through, a measurement of the tunable elements will give you a total amplitude and phase of the adjustable cancellation network. Subsequently, a passive cancellation network can be designed having the same transfer function (amplitude and phase) as the adjustable cancellation network. The passive cancellation network will also substantially cancel or reduce the electromagnetic feed through similarly to the adjustable cancellation network.

Figure 2:
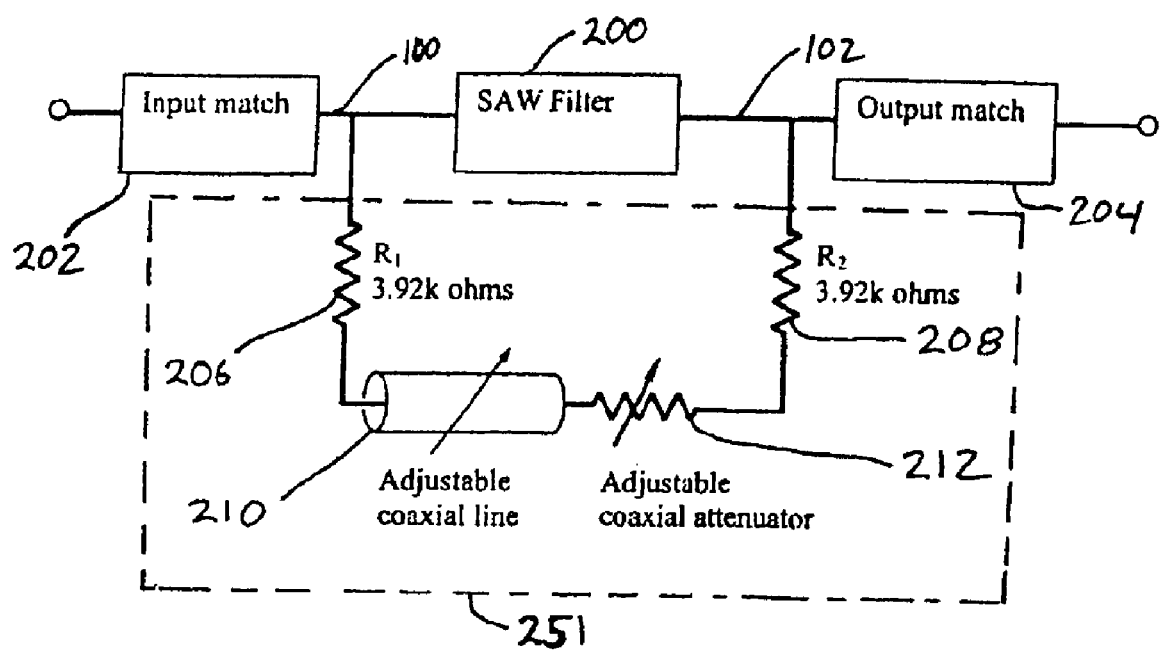
FIG. 2 is a block diagram illustrating an adjustable network for determining a reduced stop band response of a SAW filter.

Referring next to FIG. 2, shown is an adjustable network for determining a reduced stop band response of a SAW filter. Shown is a SAW filter 200, the input 100, the output 102, an input match 202, an output match 204, a first resistor 206, a second resistor 208, an adjustable coaxial line 210, an adjustable coaxial attenuator 212 and a cancellation network 251. Shown is a cancellation network 251 that can be used to determine the EM feed through present in the SAW filter 200. Other methods of determining the EM feed through in the SAW filter 200, such as a computer modeling program, may also be used.

The input 100 is connected to the input match 202 and then to the SAW filter 200. The SAW filter 200 is then connected through the output match 204 to the output 102. The cancellation network 251 is connected at one end in-between the input match 202 and the SAW filter 200 and at the other end between the SAW filter 200 and the output match 204.

SAW filters generally require impedance matching as they are designed to be compatible with different impedance systems. For example, the input match 202 and output match 204 can be impedance-matched for a 50 ohm system. In accordance with a preferred embodiment the cancellation network 251 is connected to the SAW filter 200 after the input match 202 and before the output match 204. In an alternative embodiment, the cancellation network 251 can be connected before or after the input match 202 and output match 204, respectively. In this embodiment, there is more physical separation between the cancellation network 251 and the SAW filter 200, requiring longer transmission lines to make connection, resulting in additional variation due to PC board tolerances. This is further described herein with reference to FIG. 8.

Figure 3:
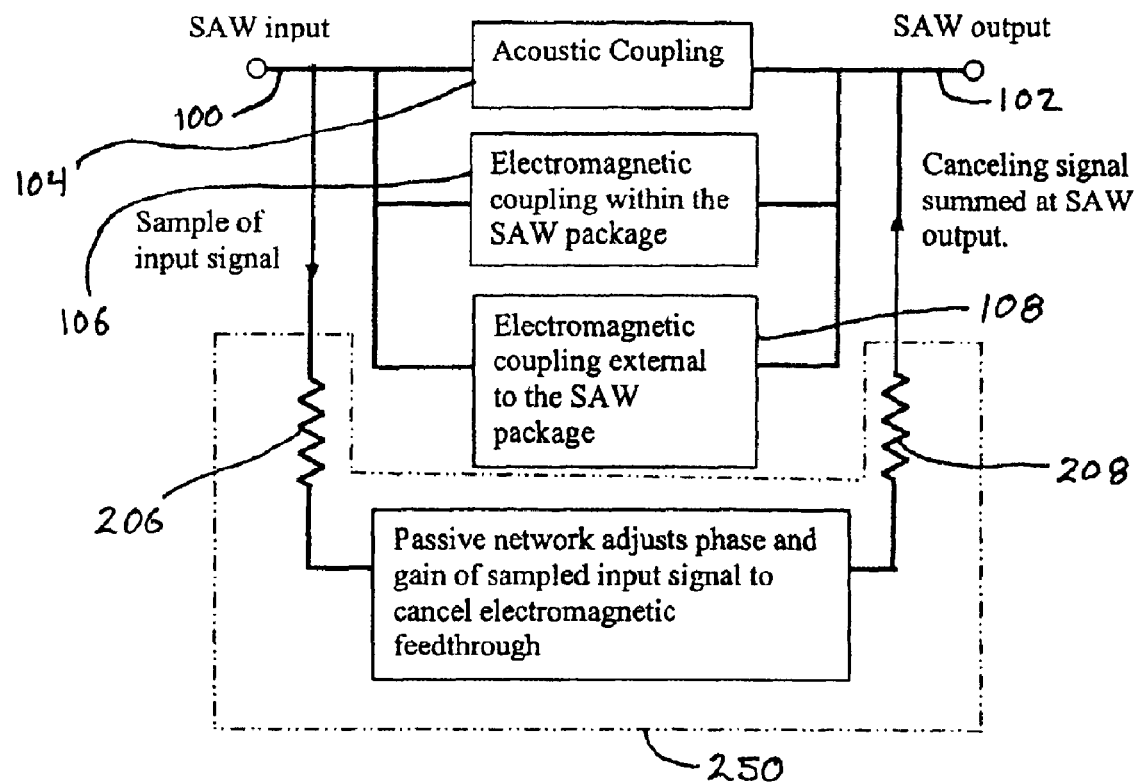
FIG. 3 is a block diagram illustrating a passive network coupled to a SAW filter.

The adjustable coaxial line 210 and the adjustable coaxial attenuator 212 are used to determine the phase and gain of the transfer function required to cancel the electromagnetic feed through in the SAW filter 200. The adjustable coaxial line 210 and the adjustable coaxial attenuator 212 are adjusted until the desired stop band response is determined. The frequency response of the output of the SAW filter 200, shown in FIG. 6, can be monitored on, for example, a network analyzer (not shown). In a preferred embodiment, the adjustable coaxial line 210 and the adjustable coaxial attenuator 212 are adjusted until the stop band response is minimized. Next, the phase and gain of the adjustable coaxial line 210, the adjustable coaxial attenuator 212, the first resistor 206 and the second resistor 208 are measured so that the transfer function that reduces or minimizes the stop band response is known. As shown in FIG. 3, a passive cancellation network 250 with approximately the same transfer function can be substituted for the adjustable cancellation network 251.

In one embodiment the first resistor 206 and second resistor 208 are chosen to be large with respect to the impedances at the SAW filter 200 to reduce loss due to loading. For example both the first resistor and the second resistor can be 3.92K ohms.

Figure 6:
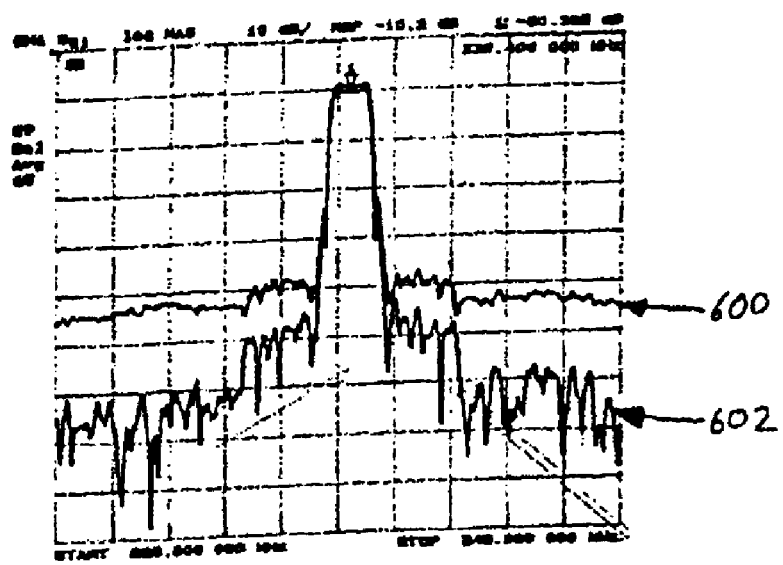
FIG. 6 is a frequency plot illustrating the improved stop band response of the SAW filter.

In one embodiment, the cancellation network 251 is connected to a 238.4 MHz SAW filter for use in transceivers in a CDMA base transceiver station (BTS). In other embodiments, the SAW filter and cancellation network can be used in any other apparatus using a SAW filter. For example, the cancellation network can be used with a SAW filter in a cellular telephone or other communication devices. The adjustable cancellation network 251 was connected to the 238.4 MHz SAW filter and was adjusted until the stop band response was reduced, such as is shown in FIG. 6. The transfer function of the adjustable cancellation network 251 was then measured to have a gain of −69.9 dB and a phase of −86.8 degrees, measured in a 50 ohm system.

Referring next to FIG. 3, shown is a block diagram illustrating a passive network coupled to the SAW filter 200. Shown is the input 100, the output 102, the acoustic coupling 104, the internal electromagnetic coupling 106, the external electromagnetic coupling 108, the first resistor 206, the second resistor 208, and a passive cancellation network 250.

The passive cancellation network 250 is designed to have a similar phase and gain of the adjustable cancellation network 251. Because of the similar phase and gain, the passive cancellation network 250 will also cancel out the electromagnetic feed through of the SAW filter 200. This provides the output with a reduced stop band output such as is shown in FIG. 6. The passive cancellation network 250 is shown in greater detail in FIG. 5. The passive cancellation network 250 is designed according to the electromagnetic coupling that is present in the SAW filter 200 and may vary greatly depending upon the SAW filter 200 and the application in which it is being used.

The electromagnetic feed through of the SAW filter 200 comes from both inside and outside of the device and will be different for different applications using the same SAW device. In general, the internal EM coupling 106 of the SAW can vary from one design type to another and external electromagnetic coupling 108 can vary greatly depending upon which system or apparatus the SAW device 200 is being used in. Thus, the cancellation network may change depending upon the SAW type used and where the SAW device is being used, as the internal EM coupling 106 and external EM coupling 108 may have changed. As described above, SAW devices are used in a great number of different technologies and applications, thus, may require many different cancellation networks depending upon the SAW type and application. Furthermore, the cancellation network may either cancel all of the electromagnetic coupling or partially cancel, i.e., reduce the electromagnetic coupling at the output of the SAW device. Thus, the passive cancellation network 250 achieves a reduction in the stop band response of the SAW filter 200.

Figure 4:
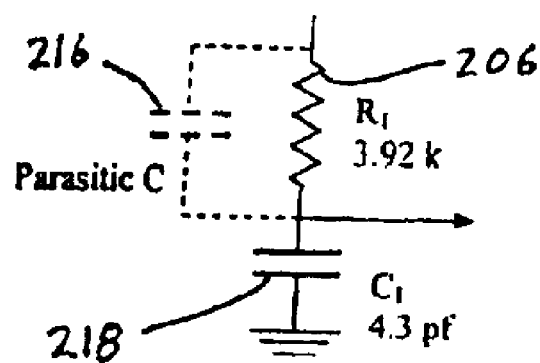
FIG. 4 is a circuit diagram illustrating a first section of the passive network of FIG. 3.
Figure 5:
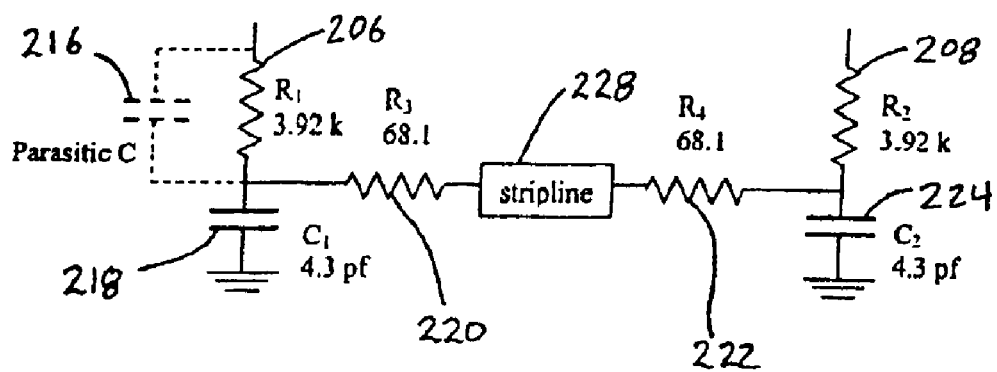
FIG. 5 is a circuit diagram illustrating the first section and a second section of the passive network of FIG. 3.
Figure 7:
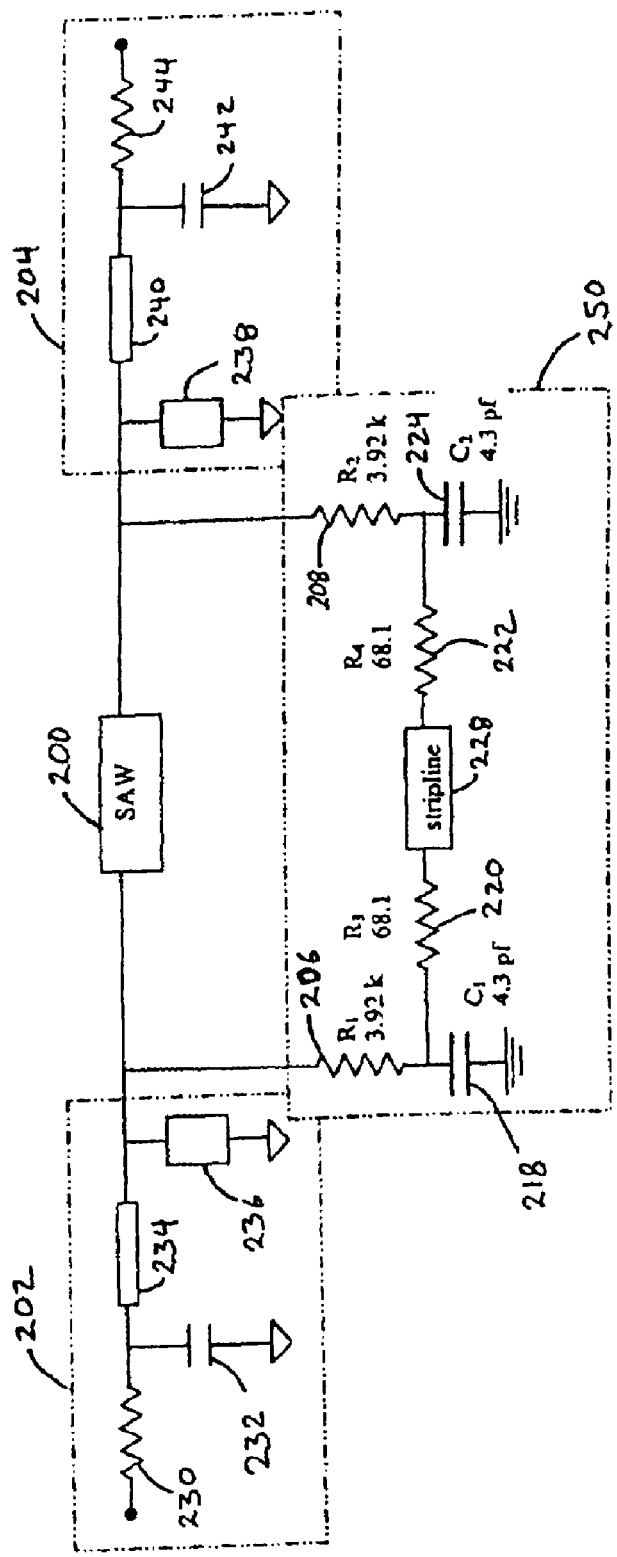
FIG. 7 is a circuit diagram illustrating the SAW filter and cancellation network.

Referring next to FIG. 4, illustrated is a first section of the passive cancellation network 250. Shown is the first resistor 206, a capacitor 218 and a parasitic capacitor 216. The cancellation network 250 shown in FIGS. 4, 5, and 7 is designed for a 238.4 MHz SAW filter for use in transceivers in a SC4812 CDMA base station. Thus, a passive cancellation network is shown that has an approximate gain of −69.9 dB and an approximate phase of −86.8 degrees, which is the same gain and phase of the adjustable cancellation network 251. This provides for a passive cancellation network 250 that will reduce the stop band of the SAW filter 200 similarly to the adjustable network shown in FIG. 2.

The first resistor 206 is a 3.92K ohm resistor. In this exemplary embodiment the capacitor 218 is a 4.3 pf capacitor. The parasitic capacitor 216 is shown with dashed lines to represent the capacitance that is present in non-ideal components, such as the first resistor 206. The corner frequency of the first section is selected to be much lower than the SAW filter's stop band of interest. In this exemplary embodiment the corner frequency is 9.5 MHz (ignoring source impedance in series with resistor 206), resulting in near a −90 degree phase shift over a wide band of frequency in the SAW filter's stop band of interest. Because the components used are not ideal (represented by the parasitic capacitor 216) a slight reduction in the phase shift will actually typically result. The first section of the passive network 250 will achieve most of the −69.9 dB loss and near a −90 degree phase shift. The value of the first resistor 206 has major impact on loss and minor impact on phase at the frequencies of interest. In another embodiment, if a phase shift of approximately +90 degrees is desired, the capacitor 218 can be replaced by an inductor. This may be desired when the SAW filter is used in an application other than in the SC4812 CDMA base station or when a different type of SAW filter is used.

Referring next to FIG. 5, shown is the first section and a second section of the passive network. Shown is the first resistor 206, the second resistor 208, a third resistor 220, a fourth resistor 222, the parasitic capacitor 216, the first capacitor 218, a second capacitor 224, and a transmission line 228.

The second section of the passive network includes the third resistor 220, the fourth resistor 222, and the second capacitor 224. The second section has a corner frequency somewhat greater than the stop band frequency of interest. The second corner frequency is set by resistors 220, 222 and capacitor 224 and has a corner frequency of about 272 MHz (neglecting the source impedance of the first section to simplify the analysis). The second section provides a small phase shift and small gain. The third resistor 220 and the fourth resistor 222 are fine tuning elements for the phase shift, however, and have only a very small impact on the gain of the passive network 250. The transmission line 228 connected between the third resistor and the fourth resistor is short and has little effect on the phase or gain. The combination of the first section and the second section make up the passive cancellation network 250. The cancellation network 250 as shown can be modified for reduction of the electromagnetic feed through in many different applications. The presently shown cancellation network 250 is shown for example only and was designed specifically for use in the SC4812 CDMA base station. Other cancellation networks may be designed for application in the SC4812 CDMA base station or any other application using a SAW device 200 where there is electromagnetic feed through.

Referring next to FIG. 6, shown is a frequency plot illustrating the improved stop band response of the SAW filter 200. Shown is a frequency domain plot centered on the pass band of the SAW filter 200. Shown is a first trace 600 and a second trace 602. The first trace 600 represents the frequency response of the SAW filter 200 without the cancellation network 251 and the second trace 602 represents the frequency response of the SAW filter 200 with the cancellation network 251. The second trace shows about a 15–20 dB reduction in the frequency response in the stop band of the SAW filter 200. Additionally, the electromagnetic coupling is reduced in the pass band of the SAW filter 200, however, the pass band is designed to contain the acoustic response. Thus, the EM coupling within the pass band is a very small percentage of the total energy in the pass band. Thus, a very small reduction in the pass band, if any, may be achieved. However, the electromagnetic coupling is reduced in the entire output of the SAW filter 200. In a preferred embodiment of the present invention up to 100% of the electromagnetic coupling is reduced by one of the cancellation networks 250, 251. In other embodiments the cancellation networks 250, 251 may cancel less than 100% of the electromagnetic coupling due to component tolerance or effective bandwidth of the network. In other embodiments, the acoustic response of the SAW filter dominates the stop band attenuation which will limit the benefit of the cancellation networks 250, 251 to a 2 dB or greater reduction in stop band attenuation in various embodiments.

Referring next to FIG. 7, shown is a circuit diagram illustrating the SAW filter and cancellation network. Shown is the input match 202, the output match 204, the passive cancellation network 250, and the SAW filter 200.

The input match 202 and the output match 204 are also shown in FIG. 2. The input match includes a resistor 230, a capacitor 232, a transmission line 234 and an inductor 236. In this embodiment the input match is designed to properly terminate the SAW filter in a 50 ohm impedance system. The resistor 230 has a value of 475 ohms. The capacitor 232 has a value of 4.3 pf and the inductor has a value of 47 $\mu$H. The output match has similar values for the corresponding resistor 244, capacitor 242, transmission line 240 and inductor 238.

The cancellation network 250 is connected to the SAW filter 200 after and before the input match 202 and output match 204, respectively. Alternatively, the cancellation network 250 can be connected on the other side of the input match 202 and the output match 204. The output match 204 and the input match 202 both include a length of transmission line 240 and 234.

As described above, the cancellation network 250 shown is for use in a SC4812 CDMA base station. The same SAW device 200 used in a different application may have a different cancellation network 250 required to cancel the electromagnetic feed through, as the external electromagnetic feed through may have changed. The desired cancellation network 250 to be used depending upon the application can be determined using the methods described herein.

Figure 8:
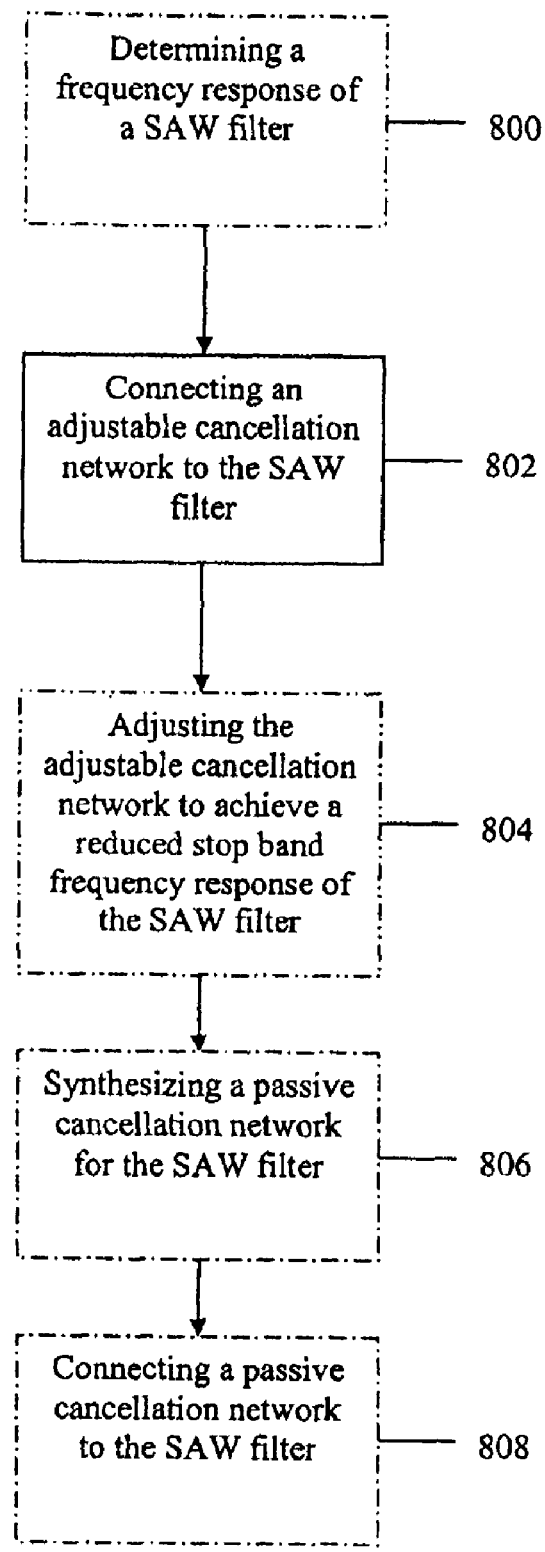
FIG. 8 is a flow chart illustrating a method of reducing electromagnetic feed through in a SAW filter.

Referring next to FIG. 8, shown is a flow chart illustrating a method of reducing electromagnetic feed through in a SAW device. First, the frequency response of the SAW device is determined 800. This can be done by viewing the frequency response on a network analyzer. Alternatively, the frequency response can be determined using a computer modeling program, such as is known in the art.

Next, an adjustable cancellation network is connected to the SAW device 802. The adjustable cancellation network is then adjusted 804 to reduce electromagnetic coupling in the stop band of the SAW acoustic device. In a preferred embodiment the adjustable cancellation network is adjusted until approximately the largest reduction in the stop band is achieved, thus indicating that the electromagnetic feed through has been substantially cancelled. The reduction in the stop band can be viewed on the network analyzer while the adjustable cancellation network is being adjusted, thus, allowing for easy optimization. When the desired stop band is achieved, the transfer function of the adjustable cancellation network is measured.

Next, a passive cancellation network is synthesized 806. As described herein, many different passive cancellation networks can be designed depending upon the SAW type used and where the SAW device is being used, as the internal EM coupling and the external EM coupling may have changed. Furthermore, the passive cancellation network may either cancel all of the electromagnetic coupling or partially cancel, i.e., reduce the electromagnetic coupling at the output of the SAW device.

Next, a passive cancellation network is connected to the SAW device 808. The passive cancellation network can have approximately the same transfer function of the adjustable cancellation network such that approximately the same reduction in the stop band is achieved. In a preferred embodiment, the passive cancellation network is made from discrete components. In other embodiments, the passive cancellation network can be made from discrete components and distributed elements in the PC board. In accordance with the present method, if the desired transfer function is previously known, steps 800, 802, and 804 and 806 can be omitted and a passive cancellation network can be connected to the SAW device. In this embodiment, the passive cancellation network may either reduce or cancel the electromagnetic feed through of the SAW device.

Thus, in accordance with a preferred embodiment a reduced stop band response in a SAW filter is achieved. Other embodiments provide for a reduction in internal and external EM feed through of a SAW filter. Still other embodiments provide for a reduction or cancellation of external EM feed through of a SAW device.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

I claim:

1. An apparatus for improving a top band response of a surface acoustic wave device comprising:

a surface acoustic wave device having an output and further having external electromagnetic coupling and acoustic coupling; and a cancellation network coupled to the surface acoustic wave device to reduce external electromagnetic feed through;

wherein the cancellation network reduces the amount of external electromagnetic feed through at the output of the surface acoustic wave device.

2. The apparatus of claim 1 wherein the cancellation network is selected from a group comprising at least a passive network and an adjustable network.

3. The apparatus of claim 1 wherein surface acoustic wave device is a surface acoustic wave filter.

4. The apparatus of claim 1 further comprising:

an input matching circuit coupled to the surface acoustic wave device; and an output matching circuit coupled to the surface acoustic wave device.

5. The apparatus of claim 4 wherein the cancellation network cancels electromagnetic feed through in the input matching circuit and the output matching circuit.

6. The apparatus of claim 1 wherein the cancellation network reduces external electromagnetic feed through at the output of the surface acoustic wave device by at least 2 dB.

7. The apparatus of claim 6 wherein the cancellation network further reduces internal electromagnetic feed through at the output of the surface acoustic wave device.

8. A method for canceling electromagnetic feed through comprising the steps of:

providing a surface acoustic wave device having external electromagnetic feed through; and coupling a cancellation network to the surface acoustic wave device; and reducing the external electromagnetic feed through at an output of the surface acoustic wave device.

9. A method for canceling electromagnetic feed through of claim 8 further comprising the step of canceling substantially all of the external electromagnetic feed through.

10. A method for canceling electromagnetic feed through of claim 8 further comprising the step of reducing internal electromagnetic feed through at the output of the surface acoustic wave device.

11. A method for canceling electromagnetic feed through of claim 10 further comprising the step of canceling substantially all of the internal electromagnetic feed through and the external electromagnetic feed through at the output of the surface acoustic wave device.

12. A method for canceling electromagnetic feed through of claim 8 further comprising the step of adjusting the cancellation network to increase the reduction of the electromagnetic feed through in a atop band of the surface acoustic wave device.

13. A method for canceling electromagnetic feed through of claim 12 further comprising the step of measuring the output of the surface acoustic wave device during the step of adjusting the cancellation network.

14. A method for canceling electromagnetic feed through of claim 8 wherein the cancellation network is a passive network.

15. A method for canceling electromagnetic feed through of claim 8 wherein the cancellation network is an adjustable network.

16. A method for canceling electromagnetic feed through comprising the steps of:

providing a surface acoustic wave device having external electromagnetic feed through; and coupling an adjustable cancellation network to the surface acoustic wave device; and adjusting the cancellation network to reduce the external electronmagnetic feed through in a stop band of the surface acoustic wave device.

17. A method for canceling electromagnetic feed through of claim 16 further comprising the step of measuring a transfer function of the cancellation network.

18. A method for canceling electromagnetic feed through of claim 17 further comprising the step of synthesizing a passive cancellation network.

19. A method for canceling electromagnetic feed through of claim 17 further comprising the step of coupling a passive cancellation network to the surface acoustic wave device.

20. A method for canceling electromagnetic feed through of claim 19 wherein the passive cancellation network has a transfer function that is substantially similar to the measured transfer function of the adjustable cancellation network.

21. A method for canceling electromagnetic feed through of claim 16 further comprising the step of reducing internal electromagnetic feed through in the stop band of the surface acoustic wave device.

22. A method for canceling electromagnetic feed through of claim 16 further comprising the step of canceling external electromagnetic feed through in the stop band of the surface acoustic wave device.

23. A method for canceling electromagnetic feed through of claim 16 wherein the surface acoustic wave device is a surface acoustic wave filter.

\* \* \* \* \*